US009052560B2

(12) United States Patent
Marty et al.

(10) Patent No.: US 9,052,560 B2
(45) Date of Patent: Jun. 9, 2015

(54) NANOPROJECTOR PANEL FORMED OF AN ARRAY OF LIQUID CRYSTAL CELLS

(71) Applicants: STMicroelectronics S.A., Montrouge (FR); Commissariat à l'Énergie Atomique et aux Énergies Alternatives, Paris (FR)

(72) Inventors: Michel Marty, Saint Paul de Varces (FR); Flavien Hirigoyen, Grenoble (FR); Josep Segura Puchades, Fontaine (FR); Hélène Wehbe-Alause, Grenoble (FR); Umberto Rossini, Coublevie (FR)

(73) Assignees: STMicroelectronics SA, Montrouge (FR); Commisariat A L'Energie Atomique et aux Energies Alternatives, Paris (FR)

( * ) Notice: Subject to any disclaimer, the term of this patent is extended or adjusted under 35 U.S.C. 154(b) by 189 days.

(21) Appl. No.: 13/920,206

(22) Filed: Jun. 18, 2013

(65) Prior Publication Data

US 2013/0335666 A1   Dec. 19, 2013

(30) Foreign Application Priority Data

Jun. 19, 2012   (FR) ..................... 12 55732

(51) Int. Cl.
*H01L 33/36* (2010.01)
*G02F 1/1368* (2006.01)
*G02F 1/1362* (2006.01)

(52) U.S. Cl.
CPC .............. *G02F 1/1368* (2013.01); *H01L 33/36* (2013.01); *G02F 1/136209* (2013.01); *G02F 1/136213* (2013.01); *G02F 1/136277* (2013.01); *G02F 2001/136281* (2013.01)

(58) Field of Classification Search
CPC .............. H01L 33/36; G02F 1/136213; G02F 1/136209
See application file for complete search history.

(56) References Cited

U.S. PATENT DOCUMENTS

| | | | | |
|---|---|---|---|---|
| 5,402,254 A | * | 3/1995 | Sasano et al. | ............ 349/38 |
| 5,705,424 A | | 1/1998 | Zavracky et al. | |
| 6,452,652 B1 | | 9/2002 | Moore | |

FOREIGN PATENT DOCUMENTS

| | | |
|---|---|---|
| JP | 6265932 A | 9/1994 |
| KR | 200400912 A | 10/2004 |

OTHER PUBLICATIONS

French Search Report dated Feb. 20, 2013 from corresponding French Patent Application No. 12/55732.
Nagata, T. et al., "A Novel Silicon-On-Quartz (SOQ) Device for Optical Mobile Applications," Electron Devices Meeting (IEDM), Dec. 5, 2011, IEEE, pp. 14.1.1-14.1.4.

* cited by examiner

*Primary Examiner* — Seahvosh Nikmanesh
(74) *Attorney, Agent, or Firm* — Gardere Wynne Sewell LLP

(57) ABSTRACT

A nanoprojector panel formed of an array of cells, each cell including a liquid crystal layer between upper and lower transparent electrodes, a MOS control transistor being arranged above the upper electrode, each transistor being covered with at least three metallization levels. The transistor of each cell extends in a corner of the cell so that the transistors of an assembly of four adjacent cells are arranged in a central region of the assembly. The upper metallization level extends above the transistors of each the assembly of four adjacent cells. The panel includes, for each assembly of four adjacent cells, a first conductive ring surrounding the transistors, the first ring extending from the lower metallization level to the upper electrode of each cell, with an interposed insulating material.

8 Claims, 7 Drawing Sheets

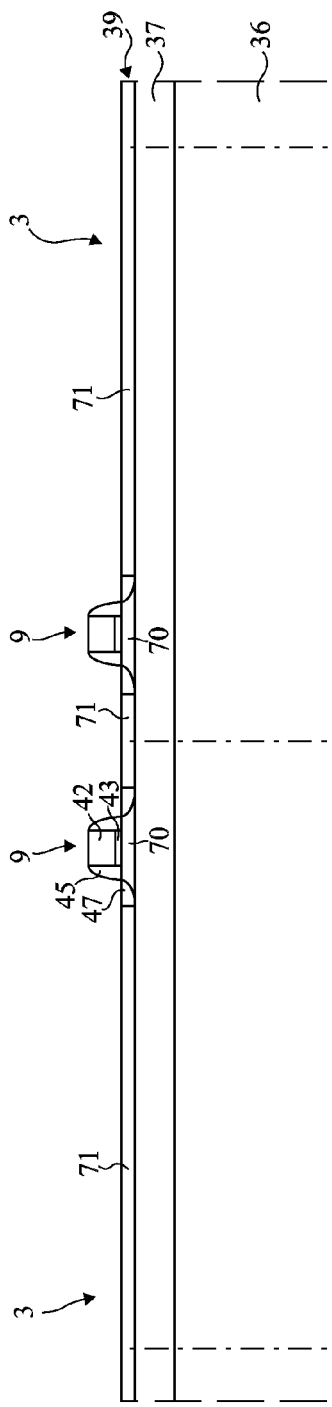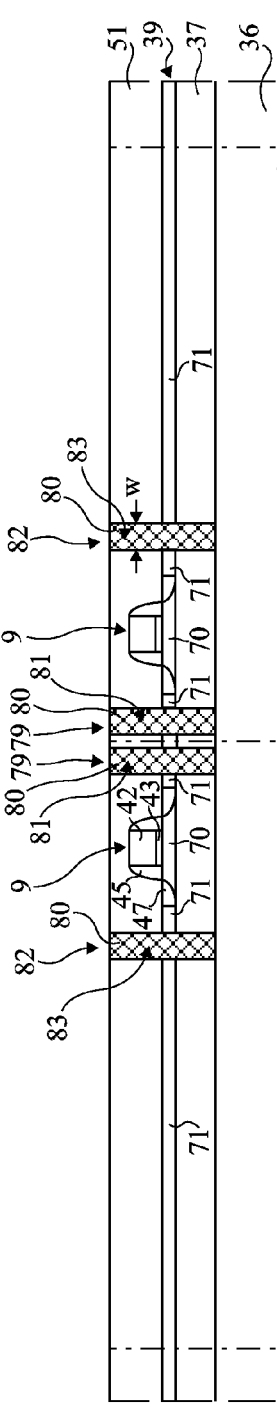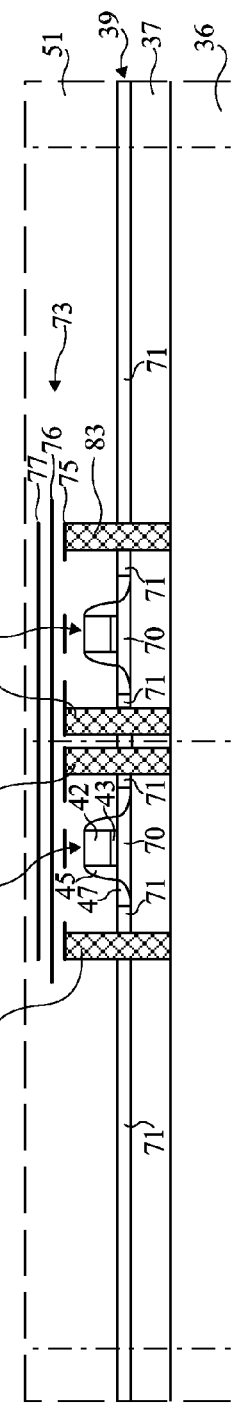

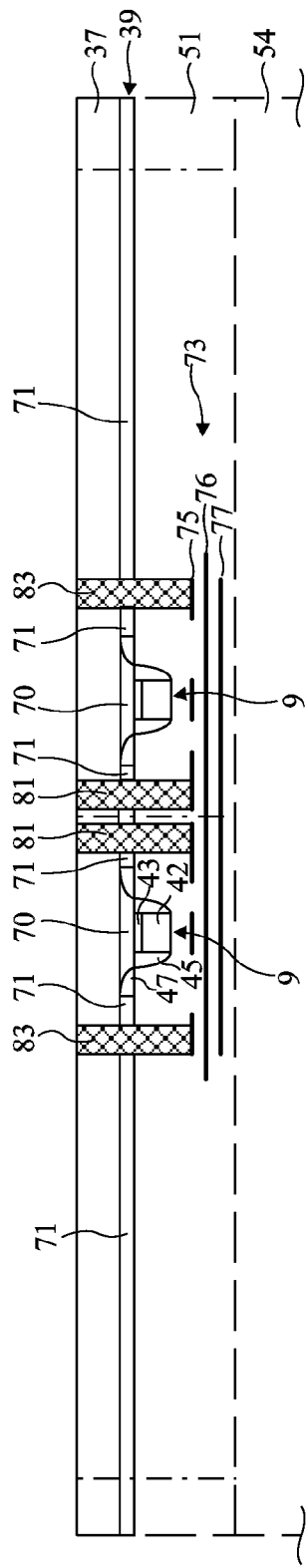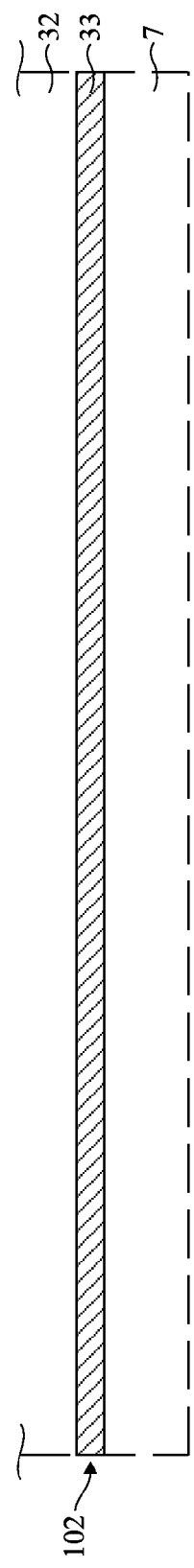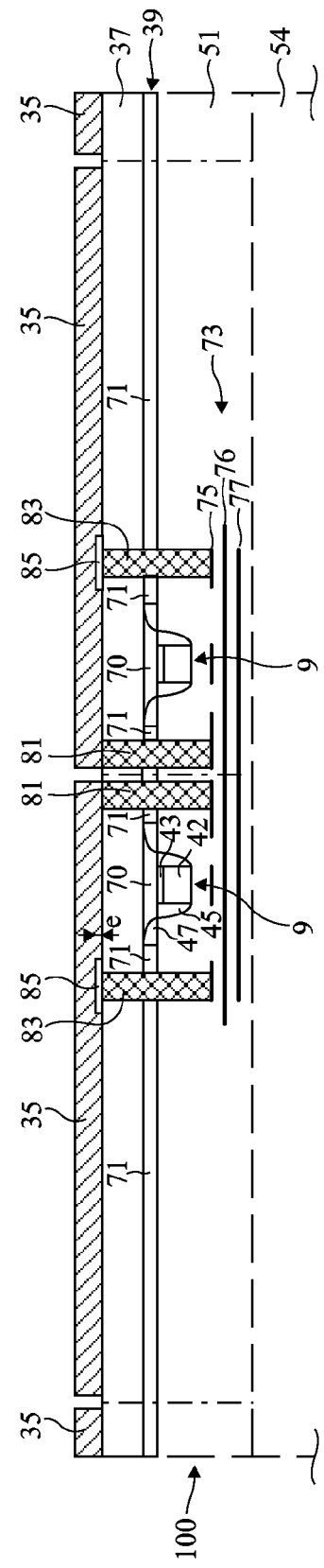

NANOPROJECTOR PANEL FORMED OF AN ARRAY OF LIQUID CRYSTAL CELLS

CROSS REFERENCE TO RELATED APPLICATIONS

This application claims the priority benefit of French patent application serial number 12/55732, filed on Jun. 19, 2012, which is hereby incorporated by reference to the maximum extent allowable by law.

BACKGROUND

1. Technical Field

The present disclosure relates to a panel formed of an array of liquid crystal cells for use in a nanoprojector.

2. Discussion of the Related Art

FIG. 1 schematically shows a panel used in a nanoprojector to project an image.

Panel 1 comprises an array of cells 3, which is shown in enlarged fashion 5 in FIG. 1. Each cell comprises a liquid crystal layer 7 housed between upper and lower transparent electrodes, not shown in FIG. 1. Each cell further comprises a MOS control transistor 9 arranged above the upper electrode. Transistors 9 are connected to row decoders 11 and to column decoders 13. Panel 1 further comprises drive circuits 15 enabling to synchronize the cell switching-on.

The light emitted by a light source 17 crosses panel 1 and an image is projected on a screen (not shown).

FIG. 2 is an electric diagram illustrating the operation of a panel of the type illustrated in FIG. 1.

For each cell 3, liquid crystal layer 7 between the upper and lower transparent electrodes forms a capacitance 21. The upper electrode of capacitance 21 is connected to a main electrode of MOS control transistor 9 of the cell. Transistor 9 enables to control the optical attenuation level of the cell.

The gate of each MOS control transistor 9 is connected to a row 23. The source of each transistor 9 is connected to a column 25. The grey levels corresponding to the image to be projected are transmitted to each cell by an electric voltage value sent onto each column 25. These values are transmitted row by row to control transistors 9.

Capacitance 21 of each liquid crystal cell has a low value, for example, on the order of a few fF. Leakage currents at the transistor level cause signal losses between two image refreshment operations. A storage capacitance 27 is thus provided and arranged in parallel with capacitance 21 to store the image data for a sufficiently long time.

FIG. 3 is a cross-section view schematically showing a portion of a panel of the type illustrated in FIG. 1. Dotted lines 31 delimit cells 3.

Each cell 3 comprises a liquid crystal layer 7 between a lower transparent electrode 33 and an upper transparent electrode 35. Lower transparent electrode 33 is laid on a transparent plate 32. Lower transparent electrode 33 continuously extends under liquid crystal layer 7 and is common to all cells 3, while an upper transparent electrode 35 is associated with each cell 3. Upper electrodes 35 are arranged at a distance from one another to avoid short-circuiting the cells.

A silicon oxide layer 37 covered with a layer 39 is arranged above upper electrodes 35. As will be seen hereafter in the context of a panel manufacturing embodiment, layers 37 and 39 respectively correspond to the buried oxide layer, currently called BOX ("Buried OXide"), and to the active layer of a substrate of silicon-on-insulator type (SOI).

For each cell 3, a MOS control transistor 9 has been formed in a silicon layer 40 of layer 39, the rest, 41, of layer 39 having been oxidized. It should be noted that regions 41 are transparent. Each MOS transistor 9 comprises a gate 42 extending on silicon area 40 and insulated therefrom by a gate insulator 43. Spacers 45 are present on both sides of gate 42. Source and drain 47 extend in silicon area 40 on either side of gate 42.

Regions 41 of layer 39 and MOS transistors 9 have been covered with an insulating layer 51, itself covered with metallization levels 53 separated by insulating layers. There, for example, are six metallization levels 53, designated with reference numerals 55 to 60. A transparent plate 54 covers the structure.

For each cell 3, a via 61 of a conductive material connects a metallization of lower metallization level 55, connected to a main electrode of MOS control transistor 9, to upper electrode 35.

Generally, lower metallization level 55 and intermediary metallization level 56 are used to form the source, drain, and gate contact connections of control transistors 9. Upper metallization level 60 is used to power the cells.

For each cell, upper metallization level 60 extends above control transistor 9 and is used as an optical screen to protect transistors 9 from light rays.

In the case of a cell comprising six metallization levels, there remain at least two metallization levels, for example, intermediate levels 57, 58, 59, which may be used to form a MIM (Metal Insulator Metal) capacitance integrated above the MOS control transistor, such a MIM capacitance forming storage capacitance 27 of the cell.

Further, the useful surface area of each cell corresponds to the cell surface area which is capable of being crossed by light rays, which excludes the surface area taken up by transistors.

When a panel of the type illustrated in FIG. 3 is used in a nanoprojector, a very intense light flow reaches the panel surface, on the side of the MOS control transistors.

A disadvantage of such a panel is that, despite the presence of the upper metallization level intended to block light rays directly reaching the control transistors, the operation of the control transistors is disturbed by parasitic radiations. As a result, the MOS control transistors have high leakage currents.

Another disadvantage of such a panel is the need to form at least from five to six metallization levels above the control transistors to be able to integrate the storage capacitance of each cell above the control transistors, in the metallization levels.

Currently, to decrease the manufacturing cost of panels intended to be used in a nanoprojector, the number of metallization levels formed above the control transistors has to be decreased. In the case where less than five metallization levels are desired to be formed, for example, only three metallization levels, the cell storage capacitance cannot be integrated above the control transistors, the metallization levels being all used to form the source, drain, and gate contact connections of the control transistors and to power the cells. For each cell, the storage capacitance is then formed next to the MOS control transistor, for example, in the form of a MOS capacitance. The useful surface area of each panel is then decreased.

There thus is a need for a panel formed of an array of liquid crystal cells intended to be used in a nanoprojector which overcomes at least some of the disadvantages of the above-described panels.

SUMMARY

Thus, an embodiment provides a panel formed of an array of liquid crystal cells intended to be used in a nanoprojector in which control MOS transistors are protected from light rays.

Another embodiment provides a panel formed of an array of liquid crystal cells intended to be used in a nanoprojector comprising MOS control transistors covered with three metallization levels only and where, for each cell, the storage capacitance is integrated in the cell without decreasing the useful surface area of the cell.

Thus, an embodiment provides a panel formed of an array of cells intended to be used in a nanoprojector, each cell comprising a liquid crystal layer between upper and lower transparent electrodes, a MOS control transistor being arranged above the upper electrode, each transistor being covered with at least three metallization levels. The transistor of each cell extends in a corner of the cell so that the transistors of an assembly of four adjacent cells are arranged in a central region of the assembly; the upper metallization level extends above the transistors of each assembly of four adjacent cells; and the panel comprises, for each assembly of four adjacent cells, a first conductive ring surrounding the transistors, the first ring extending from the lower metallization level to the upper electrode of each cell with an interposed insulating material.

According to an embodiment, the panel further comprises, for each assembly of four adjacent cells, a second conductive ring and a third conductive ring surrounding the MOS control transistors and extending above the first conductive ring, the second ring extending from the intermediate metallization level to the lower metallization level and the third ring extending from the upper metallization level to the intermediate metallization level.

According to an embodiment, the panel further comprises, for each cell, a conductive via extending from a metallization of the lower metallization level, connected to a main electrode of the MOS control transistor, to the upper transparent electrode.

According to an embodiment, the width of the first conductive ring ranges between 0.2 and 0.3 µm.

According to an embodiment, the insulating material is silicon oxide and has a thickness ranging between 1 and 5 nm.

Another embodiment provides a method for manufacturing a panel formed of an array of cells intended to be used in a nanoprojector, comprising the steps of:
  starting from a wafer comprising a semiconductor substrate covered with a first insulating layer, itself covered with a semiconductor layer;
  forming MOS control transistors in active areas of the semiconductor layer, the rest of the semiconductor layer being oxidized, the transistor of each cell being formed in a corner of the cell so that the transistors of an assembly of four adjacent cells are arranged in a central region of the assembly;
  depositing a second insulating layer on the structure and forming first openings surrounding the transistors of each assembly of four adjacent cells, from the upper surface of the second insulating layer all the way to the substrate;
  filling the first openings with a conductive material to form first conductive rings;
  forming at least three metallization levels above each transistor, metallizations of the lower metallization level being formed above the first conductive ring, the upper metallization level being formed so as to continuously cover the transistors of each assembly of four adjacent cells;
  bonding the surface of the structure supporting the metallization levels to a first transparent plate and removing the substrate to expose the first conductive rings;
  forming an insulating material above each first conductive ring;
  for each cell, covering the first insulating layer and the insulating material with a first transparent electrode;
  on a second transparent plate, forming a second transparent electrode; and
  assembling the first and second plates, so that the first and second transparent electrodes are in front of each other, with an interposed liquid crystal layer.

According to an embodiment, the method further comprises, at the step of forming of the metallization levels above each MOS control transistor, the steps of:
  forming a second conductive ring above the first conductive ring, from the intermediate metallization level to the lower metallization level; and
  forming a third conductive ring above the second conductive ring, from the upper metallization level to the intermediate metallization level.

According to an embodiment:
  at the step of forming of the first openings surrounding the MOS control transistors of each assembly of four adjacent cells, second openings are formed from the upper surface of the second insulating layer all the way to the substrate;
  at the step of filling of the first openings, the second openings are filled with the conductive material to form vias; and
  at the step of forming of the metallization levels, metallizations of the lower metallization level are formed above the vias.

The foregoing and other features and advantages will be discussed in detail in the following non-limiting description of specific embodiments in connection with the accompanying drawings.

BRIEF DESCRIPTION OF THE DRAWINGS

FIGS. 7A to 7E are cross-section views schematically illustrating successive steps of a method for manufacturing a panel intended to be used in a nanoprojector.

For clarity, the same elements have been designated with the same reference numerals in the different drawings and, further, as usual in the representation of integrated circuits, the various drawings are not to scale.

DETAILED DESCRIPTION

Figure 3:
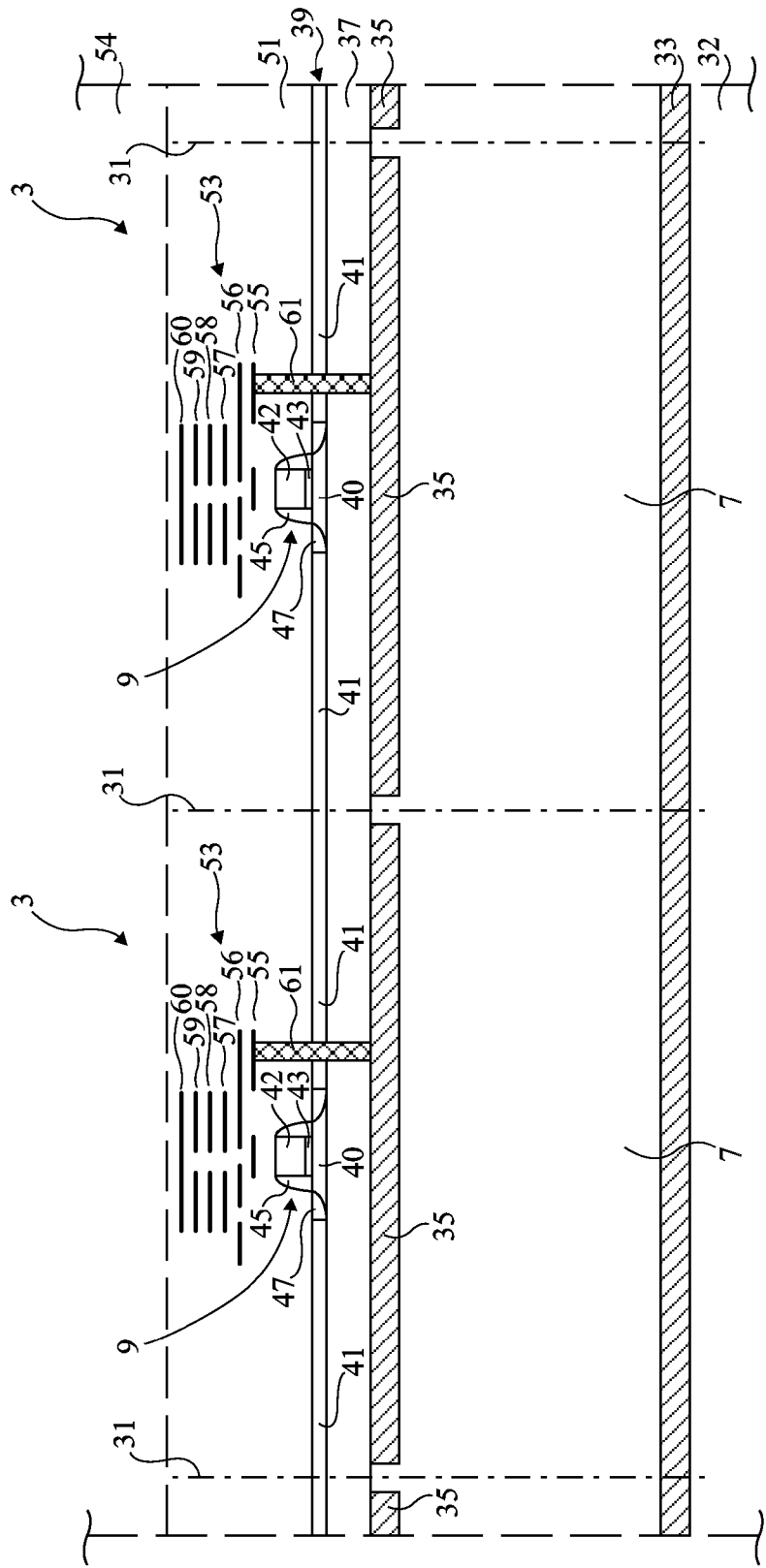
FIG. 3, previously described, is a cross-section view schematically showing a portion of a panel intended to be used in a nanoprojector.
Figure 4:
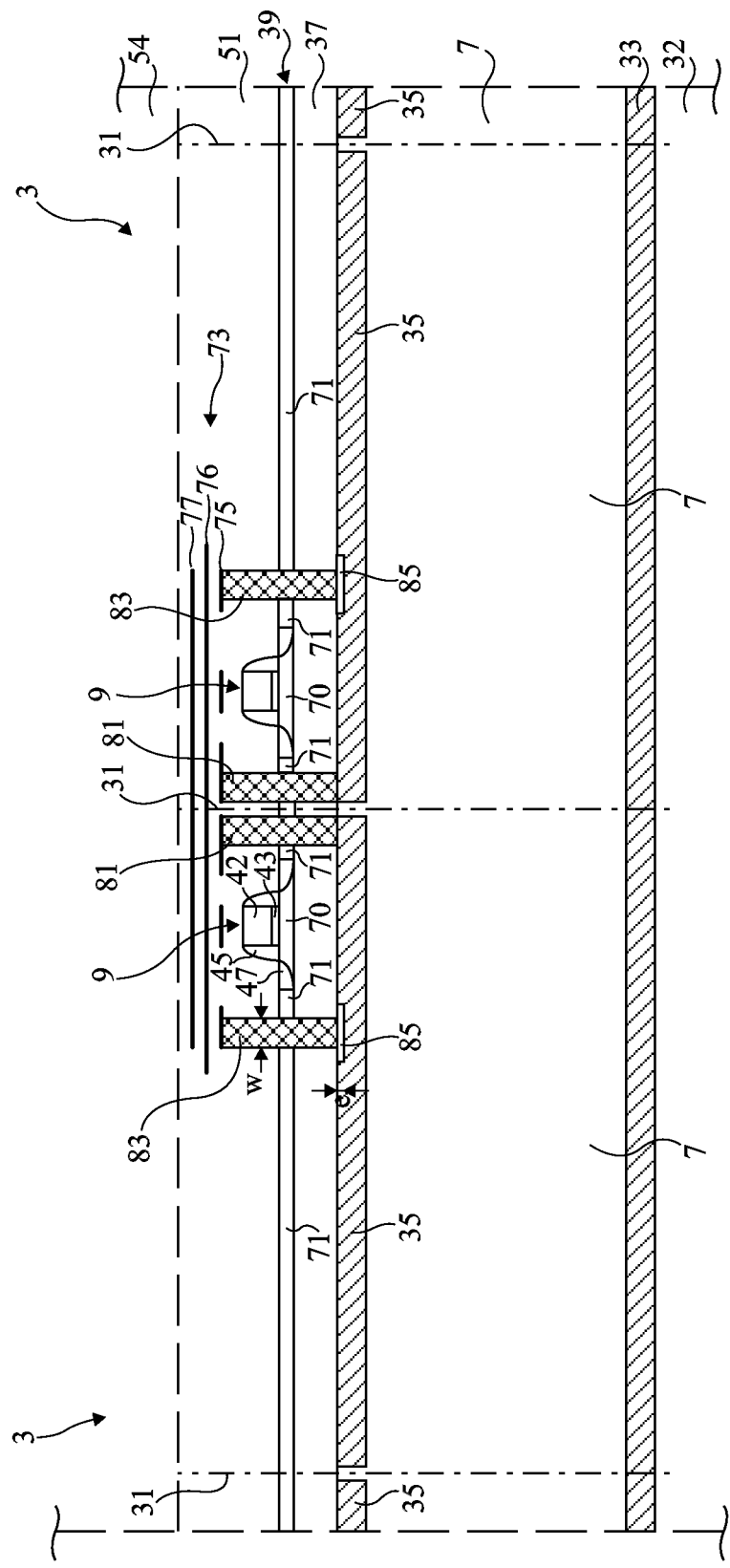
FIG. 4 is a cross-section view schematically showing a portion of an embodiment of a panel intended to be used in a nanoprojector.
Figure 5:
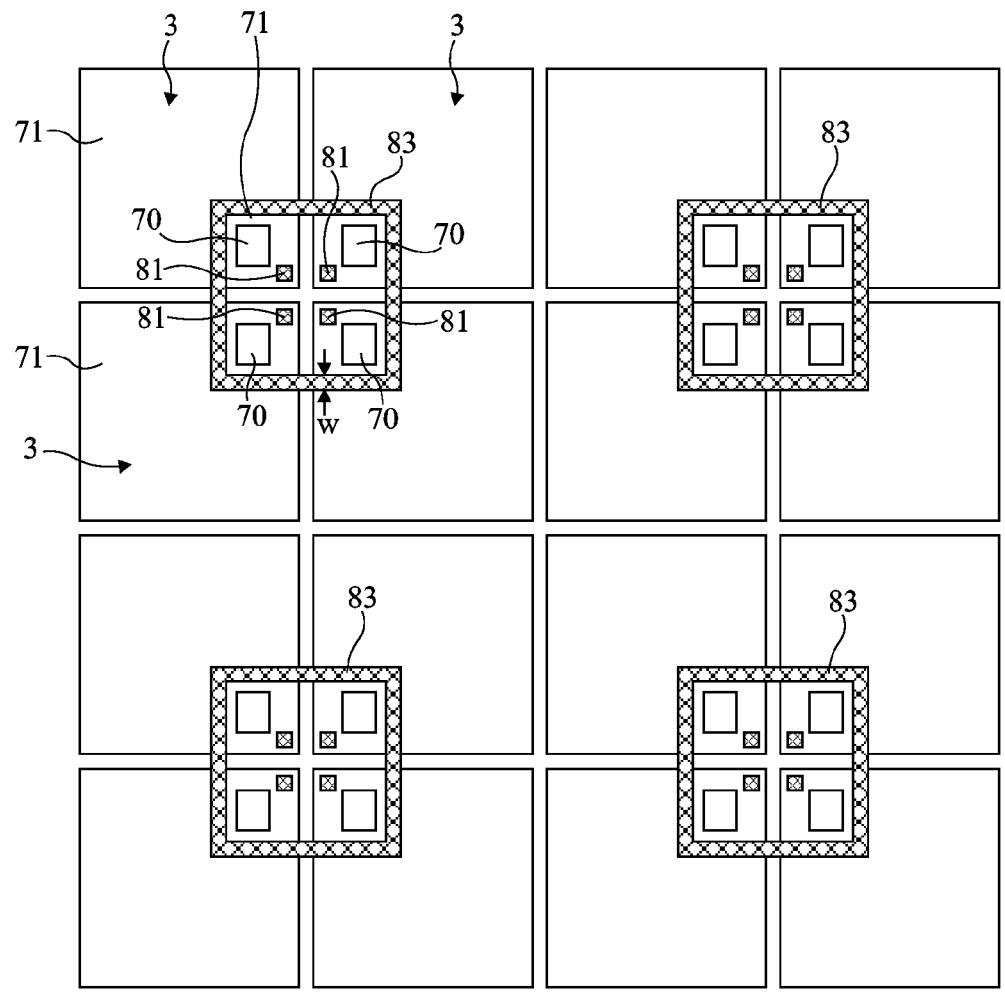
FIG. 5, corresponding to FIG. 4, is a top view schematically showing a portion of a panel intended to be used in a nanoprojector.

FIG. 4 is a cross-section view schematically showing a portion of a panel intended to be used in a nanoprojector. The elements common with those of FIG. 3 are designated with the same reference numerals and will not be described again hereafter. FIG. 5 is a top view showing cells of the panel illustrated in FIG. 4, not all the elements of FIG. 4 being shown in FIG. 5.

For each cell 3, a MOS control transistor 9 has been formed in a silicon area 70 of layer 39, located in a corner of the cell. The rest, 71, of layer 39 has been oxidized. As shown in FIG. 5, silicon areas 70 are arranged so that the control transistors of four adjacent cells are in a central region of the assembly of the four cells.

Each control transistor 9 is covered with metallization levels 73, for example, with three metallization levels 75, 76, and 77 only.

Lower metallization level 75 and intermediate metallization level 76, for example, made of copper, are used to form the source, drain, and gate contact connections of control transistors 9, and to ground silicon areas 70. Upper metallization level 77 is used to power the cells.

For each assembly of four adjacent cells, upper metallization level 77 continuously extends above control transistors 9 and is used as an optical shield to block light rays which would directly reach the control transistors.

For each cell, a via 81 made of a conductive material, for example, copper, connects a metallization of lower metallization level 75, connected to a main electrode of MOS control transistor 9, to upper electrode 35. Vias 81 are for example arranged at locations close to the center of the assembly of four cells.

To block parasitic radiations capable of laterally reaching control transistors 9, a ring 83 made of a conductive material extends from lower metallization level 75 to upper electrode 35 of each cell, ring 83 surrounding the control transistors of four adjacent cells.

Conductive ring 83 is further used as an electrode of storage capacitance 27 arranged in parallel with capacitance 21 of each liquid crystal cell.

For this purpose, a ring 85 of an insulating material extends between conductive ring 83 and upper electrode 35 of each cell. Insulating ring 85 forms the dielectric of storage capacitance 27 of each cell, conductive ring 83 forms one of its electrodes, and upper electrode 35 forms its other electrode.

Figure 1:
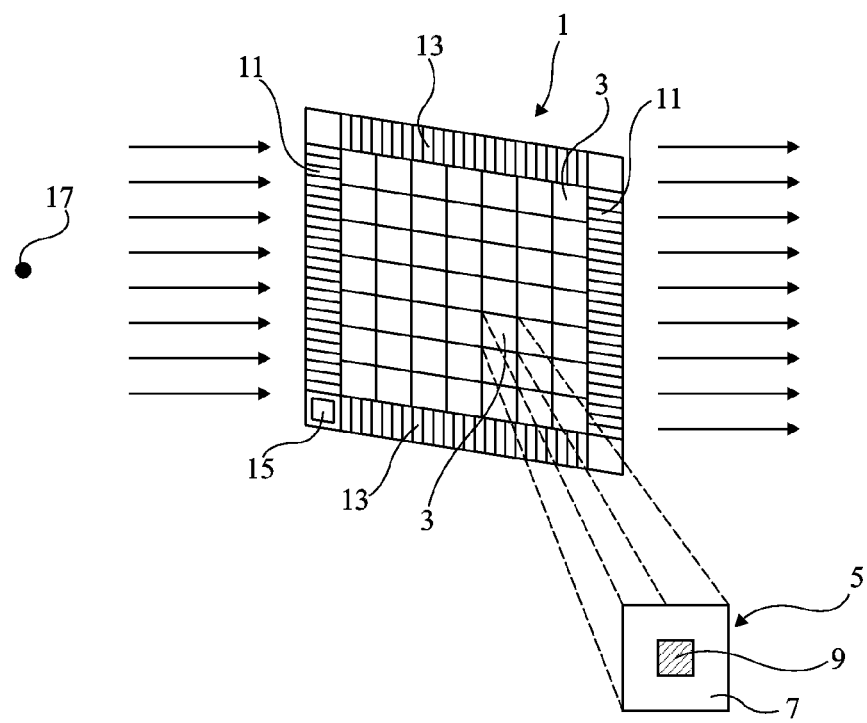
FIG. 1, previously described, schematically shows a panel used in a nanoprojector to project an image.
Figure 2:
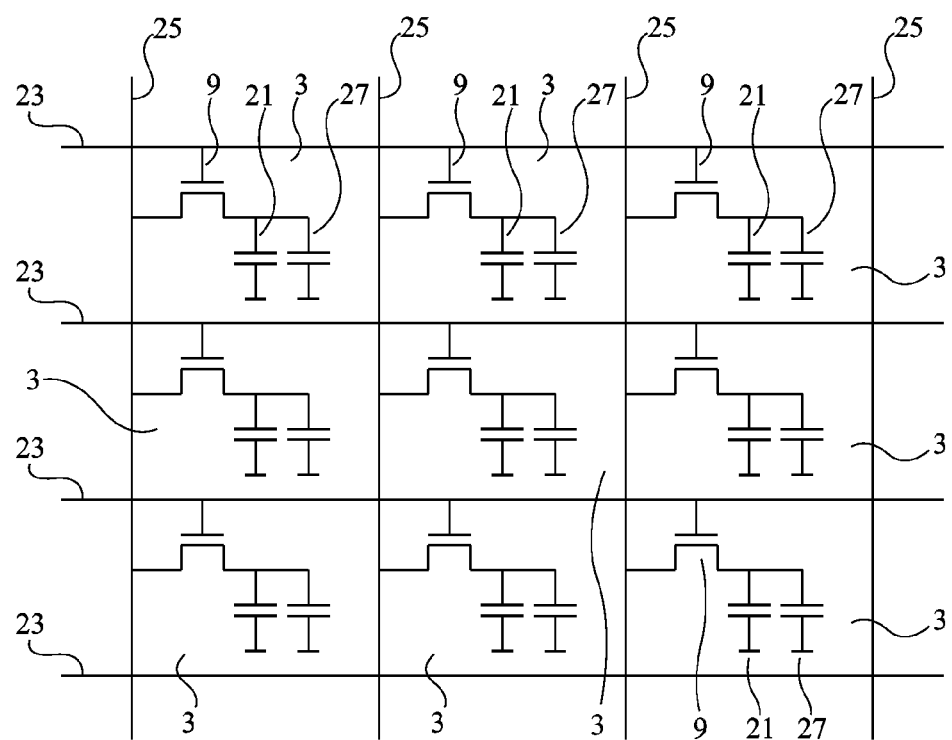
FIG. 2, previously described, is an electric diagram illustrating the operation of a panel used in a nanoprojector to project an image.

Conductive ring 83 is grounded, like lower electrode 33 common to all cells, according to the electric diagram of FIG. 2.

Width W of conductive ring 83 and thickness e of insulating ring 85 and its nature are selected to obtain the desired value for the storage capacitance.

An advantage of a panel of the type illustrated in FIGS. 4 and 5 is that the control transistors are protected from light rays directly reaching the control transistors, as previously, by the upper metallization level, and from lateral parasitic radiations by the conductive rings surrounding the control transistors of four adjacent cells.

Another advantage of such a panel is due to the fact that the conductive ring surrounding the control transistors of four adjacent cells, intended to protect the control transistors from parasitic radiations, also forms an electrode of the storage capacitance of each cell. Thus, the control transistors may be covered with three metallization levels only, without it being necessary to form the storage capacitance of each cell next to the control transistors, and thus without decreasing the useful cell surface area.

Figure 6:
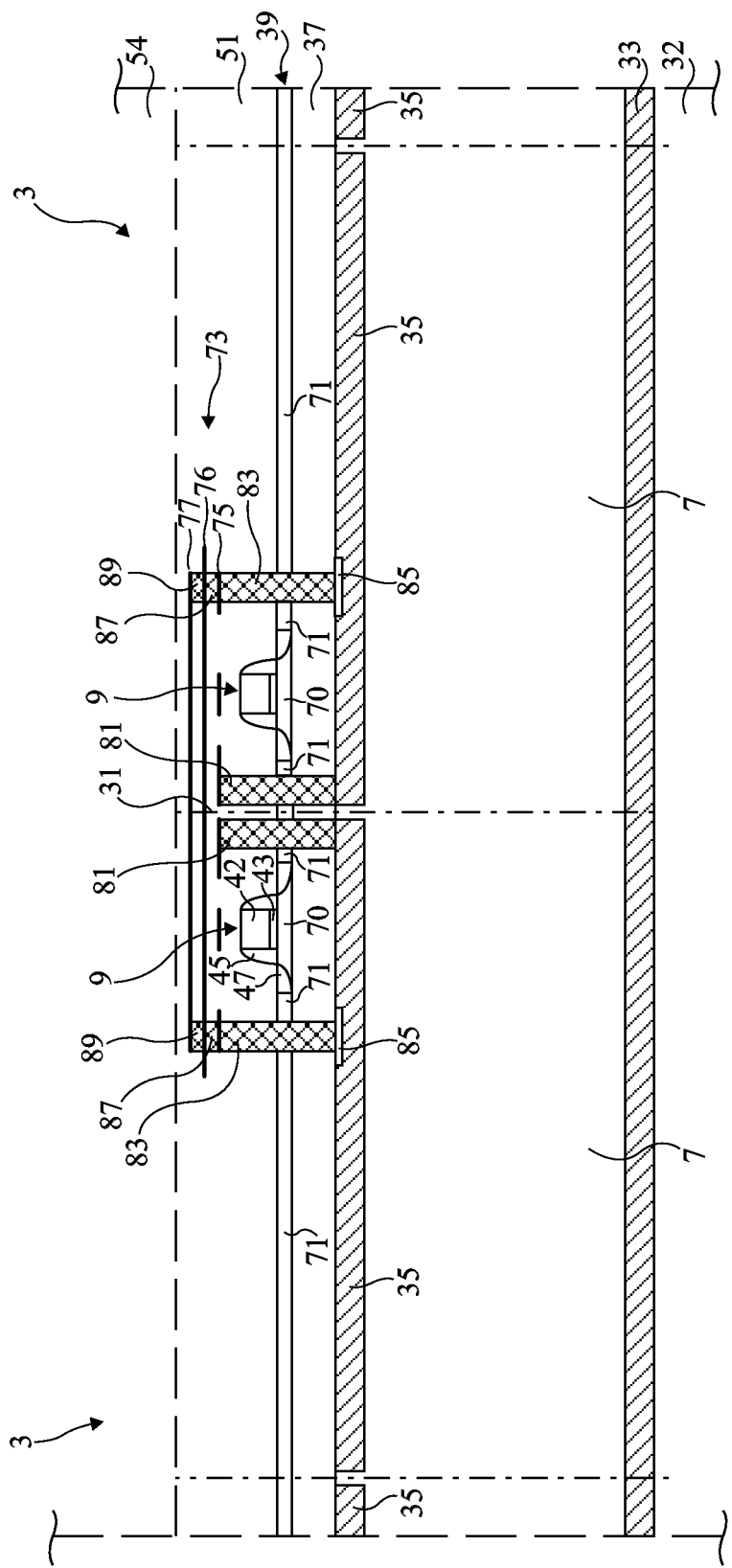
FIG. 6 is a cross-section view schematically showing a portion of another embodiment of a panel intended to be used in a nanoprojector.

FIG. 6 is a cross-section view schematically showing a portion of an alternative panel intended to be used in a nanoprojector.

In addition to conductive ring 83 surrounding the control transistors of four adjacent cells, conductive rings 87 and 89 are arranged above ring 83 to further improve the protection of control transistors 9 from parasitic radiations.

Ring 87 extends from intermediate metallization level 76 to lower metallization level 75. Ring 89 extends from upper metallization level 77 to intermediate metallization level 76.

Rings 87 and 89 are, for example, formed of the same conductive material as ring 83.

In a panel of the type illustrated in FIG. 6, the control transistors of four adjacent cells are totally surrounded with an opaque material, that is, above them, continuous upper metallization level 77 and, laterally, conductive rings 83, 87, and 89.

FIGS. 7A to 7E are cross-section views schematically illustrating successive steps of a method for manufacturing a panel of the type illustrated in FIGS. 4 and 5.

FIG. 7A is a cross-section view schematically showing a substrate of SOI ("Silicon-On-Insulator") type where MOS transistors have been formed.

A semiconductor substrate 36, for example, a silicon substrate, is covered with an insulating layer 37, for example, made of silicon oxide, currently called BOX ("Buried OXide") in the art, itself covered with a semiconductor layer 39, for example, made of single-crystal silicon. The thickness of semiconductor layer 39 for example ranges between 50 and 250 nm, and for example is on the order of 150 nm.

MOS transistors 9 have been formed in active areas 70 of semiconductor layer 39. Each MOS transistor 9 comprises a conductive gate 42 insulated from the surface of semiconductor layer 39 by a gate insulator 43, spacers 45 on both sides of gate 42, and source and drain regions 47. Each MOS transistor 9 corresponds to a control transistor of a cell 3 of the panel. MOS transistors 9 have been formed in a corner of cells 3 so that the control transistors of four adjacent cells are located in a central region of the assembly of four cells. Outside of active areas 70, semiconductor layer 39 has been oxidized, which corresponds to transparent silicon oxide regions 71.

FIG. 7B illustrates the structure after the deposition of an insulating layer 51 on the structure. For each cell, an opening 79 has been formed, for example, in a corner of the cell, next to active area 70, from the upper surface of insulating layer 51 all the way to semiconductor substrate 36. At the same time as openings 79, openings 82 surrounding the control transistors of four adjacent cells have been formed from the upper surface of insulating layer 51 all the way to semiconductor substrate 36. Openings 79 and 82 have then been filled with a conductive material 80, for example, copper. Openings 79 and 82 filled with conductive material 80 respectively form vias 81 and rings 83 extending all the way to semiconductor substrate 36.

As an example of order of magnitude, width W of each conductive ring 83 for example ranges between 0.2 and 0.3 μm, for example, being on the order of 0.25 μm.

FIG. 7C illustrates the structure after the forming of metallization levels 73, for example, three metallization levels 75, 76, 77, for example, made of copper, above the MOS transistors. Metallizations of lower metallization level 75 are arranged above vias 81 and above ring 83. Upper metallization level 77 is formed to continuously cover MOS control transistors 9 of each assembly of four adjacent cells.

FIG. 7D illustrates the structure after bonding of the structure supporting metallization levels 73 to a transparent plate 54, for example, made of glass, and after removal of semiconductor substrate 36. Conductive rings 83 then emerge at the surface.

FIG. 7E illustrates the forming of a ring 85 of an insulating material above the apparent surface of conductive ring 83. Insulating ring 85 is for example made of silicon oxide or of a material of high dielectric permittivity. Insulating ring 85 for example has a thickness e ranging between 1 and 5 nm, for example being on the order of 2 nm. For each cell 3, a transparent electrode 35 has then been formed above insulating layer 37 and above insulating ring 85. A plate 100 is thus obtained.

On another transparent plate 32, for example, made of glass, a transparent electrode 33 has been formed to form a plate 102.

Plates 100 and 102 are then placed in front of each other, spacers are installed, and a liquid crystal layer 7 is inserted between plates 100 and 102. A structure of the type illustrated in FIG. 4 is then obtained.

Transparent electrodes 33 and 35 are for example made of ITO ("Indium Tin Oxide").

To form a panel of the type illustrated in FIG. 6, conductive rings 87 and 89 are formed at the metallization level forming step illustrated in FIG. 7C of a method of the type described hereabove.

Conductive ring 87 is formed above conductive ring 83 after the forming of lower metallization level 75. Conductive ring 89 is formed above conductive ring 87 after the forming of intermediate metallization level 76.

Specific embodiments have been described. Various alterations, modifications, and improvements will readily occur to those skilled in the art.

In particular, although a panel comprising a silicon oxide insulating layer 37 has been described, layer 37 may be formed of any other transparent insulating material.

Although regions 71 of silicon oxide layer 39 have been described, regions 71 may be formed of any other transparent insulating material.

Although conductive ring 83 has been described as made of a conductive material, ring 83 may comprise several layers of different conductive materials. The same is true for conductive rings 87 and 89.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A nanoprojector panel formed of an array of cells, each cell comprising a liquid crystal layer between upper and lower transparent electrodes, a MOS control transistor being arranged above the upper electrode, each transistor being covered with at least three metallization levels, wherein:
   the transistor of each cell extends in a corner of the cell so that the transistors of an assembly of four adjacent cells are arranged in a central region of said assembly;
   the upper metallization level extends above the transistors of each said assembly of four adjacent cells; and
   the panel comprises, for each said assembly of four adjacent cells, a first conductive ring surrounding the transistors, the first ring extending from the lower metallization level to the upper electrode of each cell with an interposed insulating material.

2. The panel of claim 1, further comprising, for each said assembly of four adjacent cells, a second conductive ring and a third conductive ring surrounding the MOS control transistors and extending above the first conductive ring, the second ring extending from the intermediate metallization level to the lower metallization level and the third ring extending from the upper metallization level to the intermediate metallization level.

3. The panel of claim 1, further comprising, for each cell, a conductive via extending from a metallization of the lower metallization level, connected to a main electrode of the MOS control transistor, to the upper transparent electrode.

4. The panel of claim 1, wherein the width of the first conductive ring ranges between 0.2 and 0.3 µm.

5. The panel of claim 1, wherein the insulating material is silicon oxide and has a thickness ranging between 1 and 5 nm.

6. A method for manufacturing a panel formed of an array of cells intended to be used in a nanoprojector, comprising the steps of:
   starting from a wafer comprising a semiconductor substrate covered with a first insulating layer itself covered with a semiconductor layer;
   forming MOS control transistors in active areas of the semiconductor layer, the rest of the semiconductor layer being oxidized, the transistor of each cell being formed in a corner of the cell so that the transistors of an assembly of four adjacent cells are arranged in a central region of said assembly;
   depositing a second insulating layer on the structure and forming first openings surrounding the transistors of each said assembly of four adjacent cells, from the upper surface of the second insulating layer all the way to the substrate;
   filling the first openings with a conductive material to form first conductive rings;
   forming at least three metallization levels above each transistor, metallizations of the lower metallization level being formed above the first conductive ring, the upper metallization level being formed so as to continuously cover the transistors of each said assembly of four adjacent cells;
   bonding the surface of the structure supporting the metallization levels to a first transparent plate and removing the substrate to expose the first conductive rings;
   forming an insulating material above each first conductive ring;
   for each cell, covering the first insulating layer and the insulating material with a first transparent electrode;
   on a second transparent plate, forming a second transparent electrode; and
   assembling the first and second plates, so that the first and second transparent electrodes are in front of each other, with an interposed liquid crystal layer.

7. The method of claim 6, further comprising, at the step of forming of the metallization levels above each MOS control transistor, the steps of:
   forming a second conductive ring above the first conductive ring, from the intermediate metallization level to the lower metallization level; and
   forming a third conductive ring above the second conductive ring, from the upper metallization level to the intermediate metallization level.

8. The method of claim 6, wherein:
   at the step of forming of the first openings surrounding the MOS control transistors of each said assembly of four adjacent cells, second openings are formed from the upper surface of the second insulating layer to reach the substrate;
   at the step of filing of the first openings, the second openings are filled with the conductive material to form vias; and
   at the step of forming of the metallization levels, metallizations of the lower metallization level are formed above the vias.

* * * * *